(12) United States Patent
Omodaka et al.

(10) Patent No.: US 9,183,673 B2
(45) Date of Patent: Nov. 10, 2015

(54) SIMULATION APPARATUS, SIMULATION METHOD AND NON-TRANSITORY COMPUTER READABLE RECORDING MEDIUM

(71) Applicants: Ai Omodaka, Yokkaichi (JP); Yoshiyuki Shioyama, Yokkaichi (JP); Kenji Kawabata, Yokkaichi (JP)

(72) Inventors: Ai Omodaka, Yokkaichi (JP); Yoshiyuki Shioyama, Yokkaichi (JP); Kenji Kawabata, Yokkaichi (JP)

(73) Assignee: KABUSHIKI KAISHA TOSHIBA, Tokyo (JP)

( * ) Notice: Subject to any disclaimer, the term of this patent is extended or adjusted under 35 U.S.C. 154(b) by 386 days.

(21) Appl. No.: 13/705,667

(22) Filed: Dec. 5, 2012

(65) Prior Publication Data

US 2014/0063010 A1 Mar. 6, 2014

Related U.S. Application Data

(60) Provisional application No. 61/693,859, filed on Aug. 28, 2012.

(51) Int. Cl.
*G06F 9/455* (2006.01)
*G06F 11/22* (2006.01)
*G06T 17/10* (2006.01)
*G06F 17/50* (2006.01)

(52) U.S. Cl.
CPC ............ *G06T 17/10* (2013.01); *G06F 17/5009* (2013.01)

(58) Field of Classification Search
USPC .......................................... 716/111, 116, 132
See application file for complete search history.

(56) References Cited

U.S. PATENT DOCUMENTS

| | | | |
|---|---|---|---|
| 6,355,387 B1 | 3/2002 | Fujinaga et al. | |
| 6,591,233 B1 * | 7/2003 | Sonoda | 703/14 |
| 6,980,942 B2 | 12/2005 | Kusunoki et al. | |
| 7,203,629 B2 * | 4/2007 | Ozis et al. | 703/2 |

(Continued)

FOREIGN PATENT DOCUMENTS

| | | |
|---|---|---|
| JP | 9-5981 | 1/1997 |
| JP | 9-246345 | 9/1997 |

(Continued)

*Primary Examiner* — Brian Ngo
(74) *Attorney, Agent, or Firm* — Oblon, McClelland, Maier & Neustadt, L.L.P.

(57) ABSTRACT

In accordance with an embodiment, a simulation apparatus includes a two-dimensional section dividing processing unit, a two-dimensional simulator, a one-dimensional combining processing unit, and a three-dimensional shape combining processing unit. The two-dimensional section dividing processing unit divides a three-dimensional shape as a simulation target into at least one set of two-dimensional sections intersecting with each other and defines the three-dimensional shape as the two-dimensional sections. The two-dimensional simulator runs a two-dimensional shape simulation in each time step for each of the two-dimensional sections obtained by the dividing and acquires a two-dimensional shape. The one-dimensional combining processing unit extracts a film configuration for each intersection of the two-dimensional sections from the acquired two-dimensional shape and combines the film configurations to acquire one-dimensional film configurations. The three-dimensional shape combining processing unit creates a three-dimensional structure from the acquired one-dimensional film configurations on the basis of information on the intersection.

20 Claims, 12 Drawing Sheets

(56) References Cited

U.S. PATENT DOCUMENTS

| | | | |
|---|---|---|---|
| 7,703,069 B1* | 4/2010 | Liu et al. | 716/50 |
| 2001/0025233 A1* | 9/2001 | Kusunoki et al. | 703/14 |
| 2003/0068564 A1* | 4/2003 | Liu et al. | 430/5 |
| 2006/0152196 A1* | 7/2006 | Matsumoto et al. | 320/132 |
| 2012/0210283 A1* | 8/2012 | Li et al. | 716/112 |

FOREIGN PATENT DOCUMENTS

| | | |
|---|---|---|
| JP | 11-111717 | 4/1999 |
| JP | 2000-267890 | 9/2000 |
| JP | 2001-228597 | 8/2001 |
| JP | 2001-274047 | 10/2001 |

\* cited by examiner

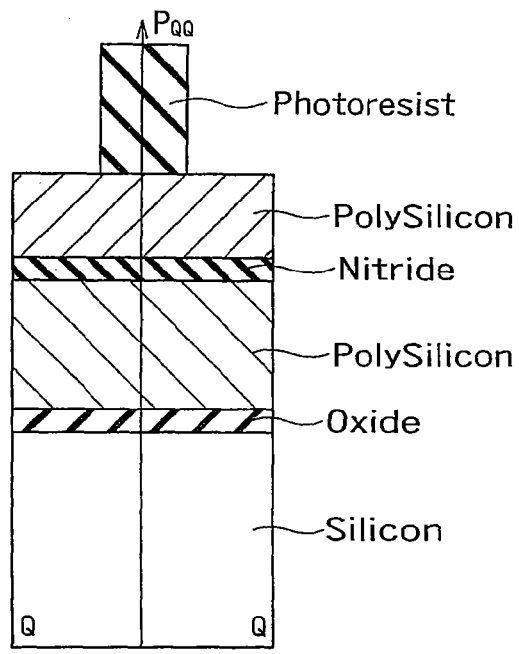
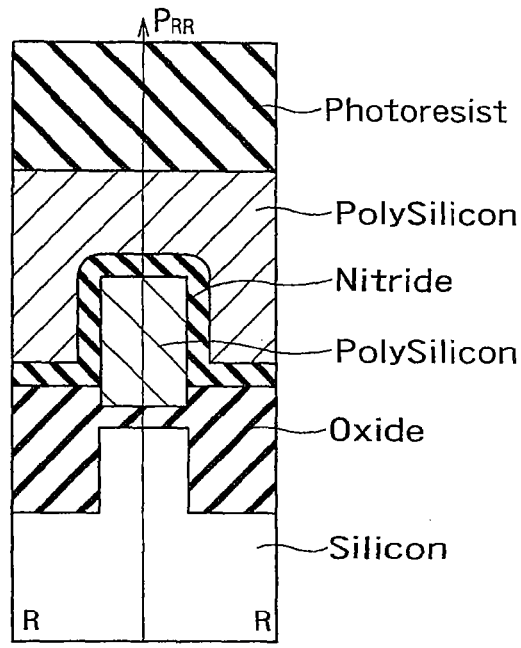
FIG. 9A  FIG. 9B
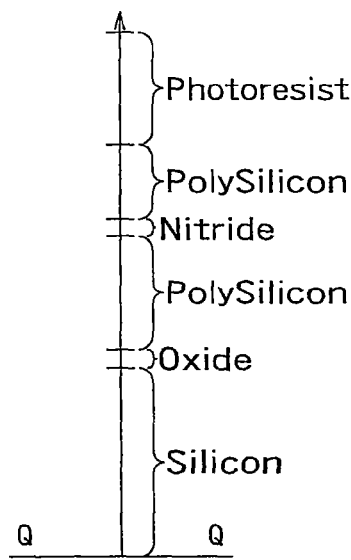
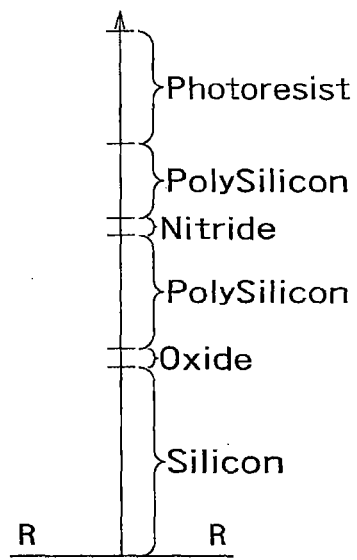
FIG. 10A  FIG. 10B

US 9,183,673 B2

SIMULATION APPARATUS, SIMULATION METHOD AND NON-TRANSITORY COMPUTER READABLE RECORDING MEDIUM

CROSS REFERENCE TO RELATED APPLICATIONS

This application is based upon and claims the benefit of priority from the prior provisional Application 61/693,859 filed on Aug. 28, 2012 in USA, the entire contents of which are incorporated herein by reference.

FIELD

Embodiments described herein relate generally to a simulation apparatus, a simulation method and a non-transitory computer readable recording medium.

BACKGROUND

In manufacturing a semiconductor device, a simulator is used for shape analysis.

However, recent miniaturization and increased complexity of semiconductor device structures have led to a considerable computation time and thus reduced processing efficiency, and caused difficulty in reducing the volume of data.

BRIEF DESCRIPTION OF THE DRAWINGS

In the accompanying drawings:

FIG. 9A and FIG. 9B are diagrams showing shapes resulting from a simulation run in a given time step together with the positional relation of the vertex for the two two-dimensional sections in FIG. 8;

FIG. 10A and FIG. 10B are diagrams showing one-dimensional film configurations respectively obtained from the simulation results in FIG. 9A and FIG. 9B;

DETAILED DESCRIPTION

In accordance with an embodiment, a simulation apparatus includes a two-dimensional section dividing processing unit, a two-dimensional simulator, a one-dimensional combining processing unit, and a three-dimensional shape combining processing unit. The two-dimensional section dividing processing unit divides a three-dimensional shape as a simulation target into at least one set of two-dimensional sections intersecting with each other and defines the three-dimensional shape as the two-dimensional sections. The two-dimensional simulator runs a two-dimensional shape simulation in each time step for each of the two-dimensional sections obtained by the dividing and acquires a two-dimensional shape. The one-dimensional combining processing unit extracts a film configuration for each intersection of the two-dimensional sections from the acquired two-dimensional shape and combines the film configurations to acquire one-dimensional film configurations. The three-dimensional shape combining processing unit creates a three-dimensional structure from the acquired one-dimensional film configurations on the basis of information on the intersection.

Embodiments will now be explained with reference to the accompanying drawings. Like components are provided with like reference signs throughout the drawings and repeated descriptions thereof are appropriately omitted.

(1) Simulation Apparatus (A) Apparatus Configuration

Figure 1:
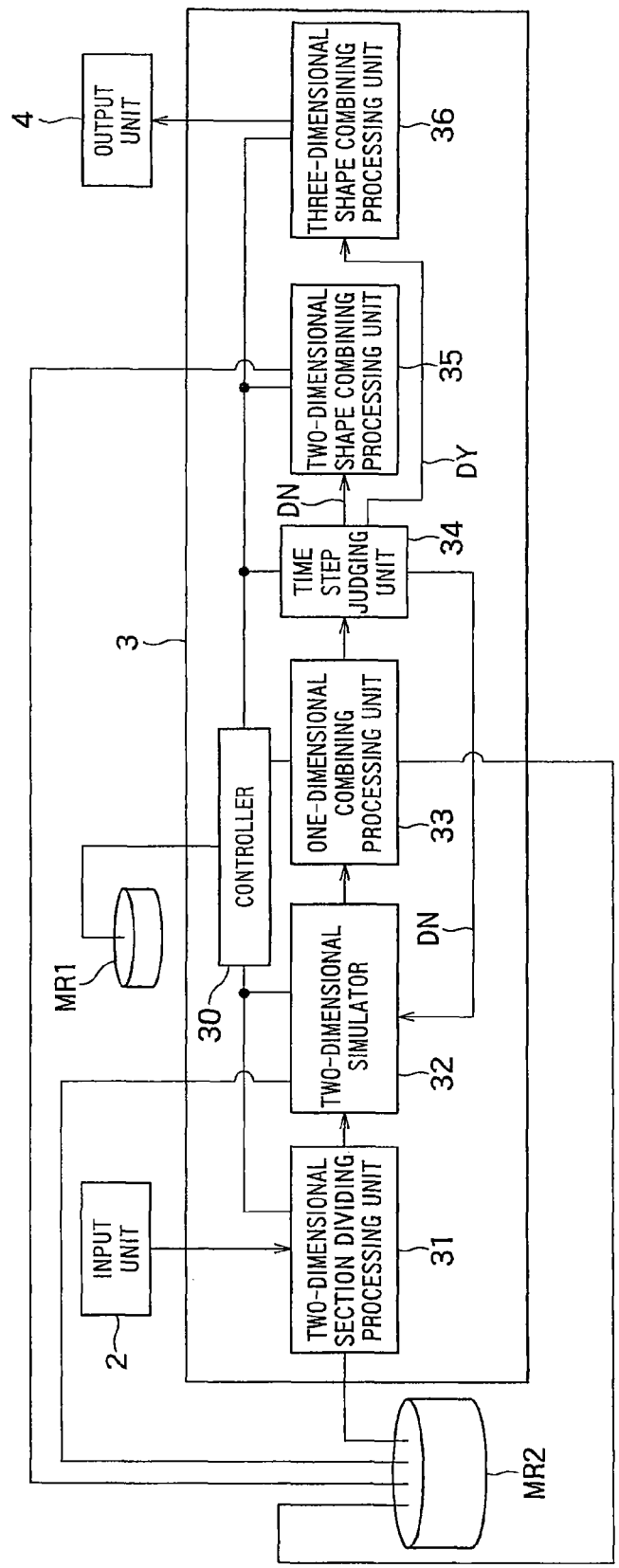
FIG. 1 is a block diagram showing a general structure of a simulation apparatus according to an embodiment.

FIG. 1 is a block diagram showing a general structure of a simulation apparatus according to an embodiment. The simulation apparatus shown in FIG. 1 includes a central processing unit 3, an input unit 2, and a display unit 4.

The input unit 2 inputs, to the central processing unit 3, data such as an initial three-dimensional shape, a mask pattern, and a time step that are necessary for a simulation in accordance with an operation by an operator. The central processing unit 3 runs a three-dimensional shape simulation on the basis of the data inputted via the input unit 2. The display unit 4 outputs the result of the simulation by the central processing unit 3, and uses a display device such as a liquid crystal display to display the simulation result in the form of, for example, graphics.

The central processing unit 3 includes a two-dimensional section dividing processing unit 31, a two-dimensional simulator 32, a one-dimensional combining processing unit 33, a time step judging unit 34, a two-dimensional shape combining processing unit 35, a three-dimensional shape combining processing unit 36, and a controller 30 connected to the above units.

The controller 30 is also connected to a recording device MR1. The recording device MR1 is configured to store a recipe file to run a later-described simulation according to an embodiment. The controller 30 draws the recipe file from the recording device MR1, and generates various control signals to control the above units 31 to 36, thereby running the three-dimensional shape simulation.

An initial three-dimensional shape and a mask pattern targeted for the simulation are inputted to the two-dimensional section dividing processing unit 31 from the input unit 2. In accordance with the mask pattern, the two-dimensional section dividing processing unit 31 divides the initial three-dimensional shape into a set of two-dimensional sections that intersect with each other, and stores, in a recording device MR2, information on a point (hereinafter referred to as an "intersection") where the two-dimensional sections intersect with each other when viewed from above.

The two-dimensional simulator 32 runs a two-dimensional shape simulation of one time step regarding the two-dimensional sections generated by the two-dimensional section dividing processing unit 31, and stores the result of the simulation in the recording device MR2.

The one-dimensional combining processing unit 33 takes out, from the recording device MR2, data on the result of the simulation by the two-dimensional simulator 32 and the intersection information, and one-dimensionally combines film configurations at each intersection, and then stores the result in the recording device MR2.

The time step judging unit 34 judges whether a time step calculated by the two-dimensional simulator 32 is a final time step among time steps inputted via the input unit 2. When judging that the time step is not the final time step, the time step judging unit 34 generates a signal DN, and supplies the signal DN to the two-dimensional simulator 32 and the two-dimensional shape combining processing unit 35. When judging that the time step is the final time step, the time step judging unit 34 generates a signal DY, and supplies the signal DY to the three-dimensional shape combining processing unit 36.

Receiving the signal DN from the time step judging unit 34, the two-dimensional shape combining processing unit 35 combines one-dimensional combination data for the film configuration at each intersection obtained by the one-dimensional combining processing unit 33 in accordance with the intersection information stored in the recording device MR2. The two-dimensional shape combining processing unit 35 thereby creates a two-dimensional section, and stores the two-dimensional section in the recording device MR2 as a newly defined two-dimensional section.

Receiving the signal DN from the time step judging unit 34, the two-dimensional simulator 32 draws the newly defined two-dimensional section from the recording device MR2 to run a two-dimensional shape simulation of the next time step, and stores the result of the simulation in the recording device MR2.

The one-dimensional combining processing unit 33 takes out, from the recording device MR2, data on the result of the simulation by the two-dimensional simulator 32 and the intersection information, and again one-dimensionally combines film configurations at each intersection, and then stores the result in the recording device MR2.

When the signal DY is outputted from the time step judging unit 34, the three-dimensional shape combining processing unit 36 then draws the one-dimensionally combined data for the film configuration at each intersection finally stored in the recording device MR2, and connects the intersections of identical films in the one-dimensional film configuration on the basis of the intersection information, thereby creating a three-dimensional structure. The three-dimensional structure as the creation result is displayed by the display unit 4.

More specific operation of the simulation apparatus shown in FIG. 1 is described with reference to FIG. 2 to FIG. 15.

(B) Operation

First, data necessary for a simulation is inputted by the operator via the input unit 2, and stored in the recording device MR2. The inputted data includes a simulation target initial three-dimensional shape, and also includes the number of simulation time steps and the mask pattern information for the initial three-dimensional shape.

Figure 2:
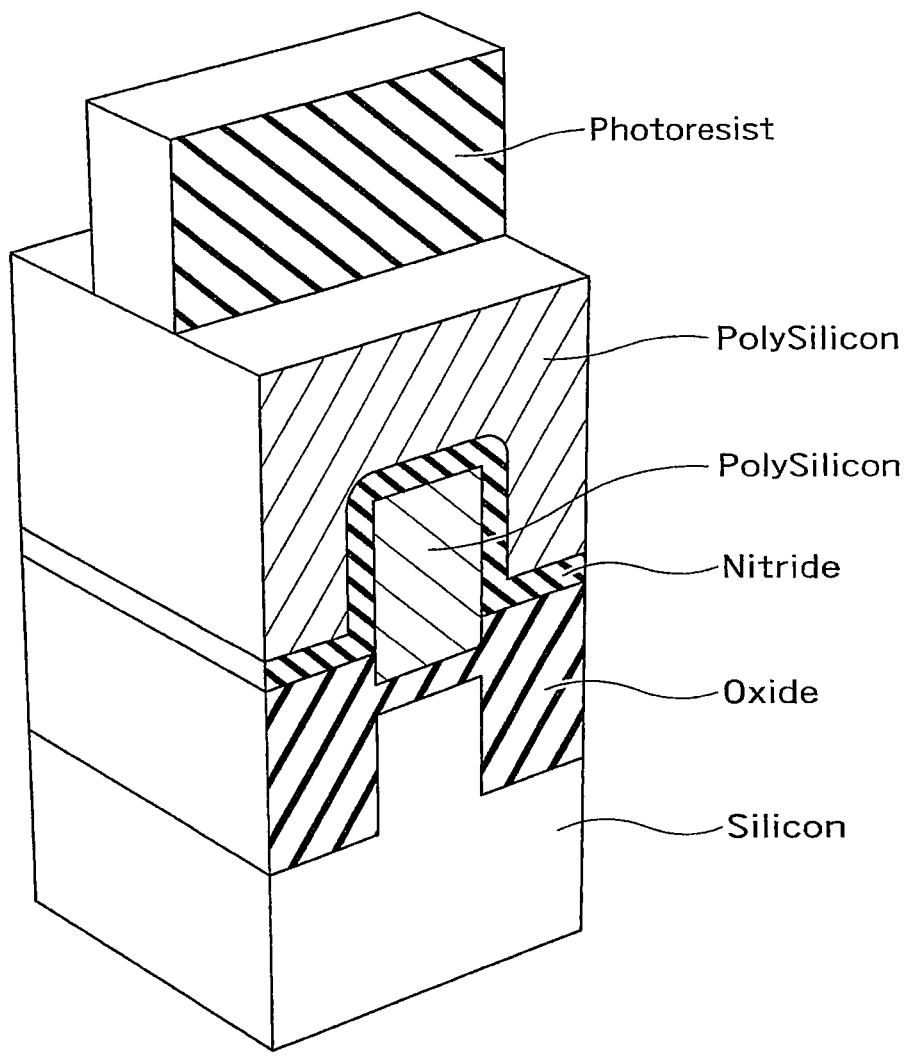
FIG. 2 is a diagram showing an example of an initial three-dimensional shape inputted to the simulation apparatus in FIG. 1.

An example of the initial three-dimensional shape is shown in FIG. 2. The mask pattern of the three-dimensional shape in FIG. 2 includes two mask patterns, for example, a layer 1 (L1) and a layer 2 (L2) shown in FIG. 3.

The two-dimensional section dividing processing unit 31 then draws the initial three-dimensional shape from the recording device MR2, divides the initial three-dimensional shape, creates a plurality of sets of two-dimensional sections that intersect with each other to have an intersection when viewed from above, and stores the sets of two-dimensional sections in the recording device MR2. At the same time, the two-dimensional section dividing processing unit 31 also stores coordinates of each intersection of the two-dimensional sections in the recording device MR2.

The three-dimensional shape does not always need to be two-dimensionally divided at regular intervals, and can be divided at any interval set by the operator. The interval of dividing does not at all need to be regular in all the time steps, and can be modified in each time step.

Figure 4:
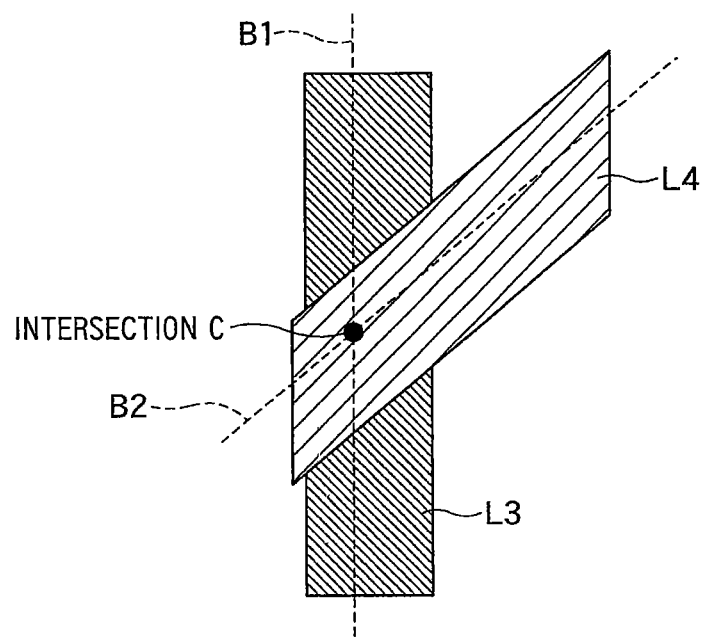
FIG. 4 is a diagram showing another example of a mask pattern inputted to the simulation apparatus in FIG. 1.

The two-dimensional sections obtained as a result of dividing do not at all need to intersect at right angles to each other. The initial three-dimensional shape can be divided in any direction in accordance with wiring lines and the mask patterns. For example, when a mask pattern including a layer 3 (L3) and a layer 4 (L4) shown in FIG. 4 is inputted, the mask pattern may be divided into two-dimensional sections B1 and B2 that intersect at an intersection C at an angle other than 90 degrees.

The two-dimensional simulator 32 then draws, from the recording device MR2, information on the two-dimensional sections obtained by dividing, runs a two-dimensional shape simulation of one time step regarding each of the two-dimensional sections, and stores the result of the simulation in the recording device MR2. The one-dimensional combining processing unit 33 then draws the simulation result and information on coordinates of each intersection from the recording device MR2, extracts a film configuration at each intersection for each of the two-dimensional sections and combines the film configurations to acquire a one-dimensional film configuration, and stores the one-dimensional film configuration in the recording device MR2.

The time step judging unit 34 then judges by contrast with the number of time steps stored in the recording device MR2 whether the time step of the current two-dimensional simulation is the final time step.

When judging that the time step is not the final time step, the time step judging unit 34 generates a signal DN, and supplies the signal DN to the two-dimensional shape combining processing unit 35 and the two-dimensional simulator 32. The two-dimensional shape combining processing unit 35 which has received the signal DN draws one-dimensional film configurations at adjacent intersections from the latest intersection coordinates stored in the recording device MR2, connects identical films from the one-dimensional film configurations at the adjacent intersections to create a new two-dimensional shape, and newly defines the two-dimensional shape as a two-dimensional section and then stores two-dimensional section in the recording device MR2. The two-dimensional simulator 32 which has received the signal DN draws the newly defined two-dimensional section from the recording device MR2, and runs a two-dimensional shape simulation of the next time step.

When judging, on the other hand, that the time step is the final time step, the time step judging unit 34 generates a signal DY, and sends the signal DY to the two-dimensional shape combining processing unit 35. The two-dimensional shape combining processing unit 35 which has received the signal DY draws, from the recording device MR2, the one-dimensional film configurations acquired by the one-dimensional combining processing unit 33 in the final time step together with their intersection information, and connects the intersections of identical films from the one-dimensional film configurations at the adjacent intersections to create a new three-dimensional shape for each of the one-dimensional film configurations at the adjacent intersections. The created three-dimensional shape is outputted as a three-dimensional shape simulation result, and displayed on the display unit 4.

Here, the two-dimensional section dividing processing unit 31 has a dynamic two-dimensional section dividing function to divide a part specified by the operator into two-dimensional sections at a desired interval when dividing the three-dimensional shape into two-dimensional sections. When the two-dimensional sections are created, the two-dimensional sections do not always need to be created at regular intervals. The three-dimensional shape includes a region which has a large shape and which is expected to three-dimensionally change. For such a region, small two-dimensional sections are created at an interval specified by the operator. For other regions, two-dimensional sections are created at a wider interval. Thus, accurate prediction of fabrication can be made with the minimum number of two-dimensional simulations, and it is possible to reduce processing time and suppress the volume of data.

As an example of such dividing interval adjustment, the adjustment of the dividing interval conforming to the relation between the mask patterns is described.

Figure 5:
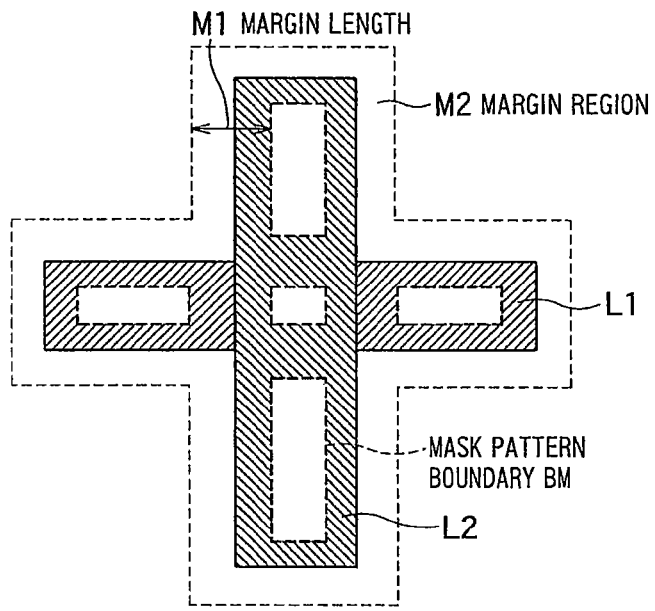
FIG. 5 is a diagram showing an example of how to set a margin region in the mask pattern in FIG. 3.

Specifically, for a mask pattern inputted via the input unit 2, the two-dimensional section dividing processing unit 31 first sets a margin region M2 with a margin length M1 around a mask pattern boundary BM, as shown in FIG. 5.

Figure 6:
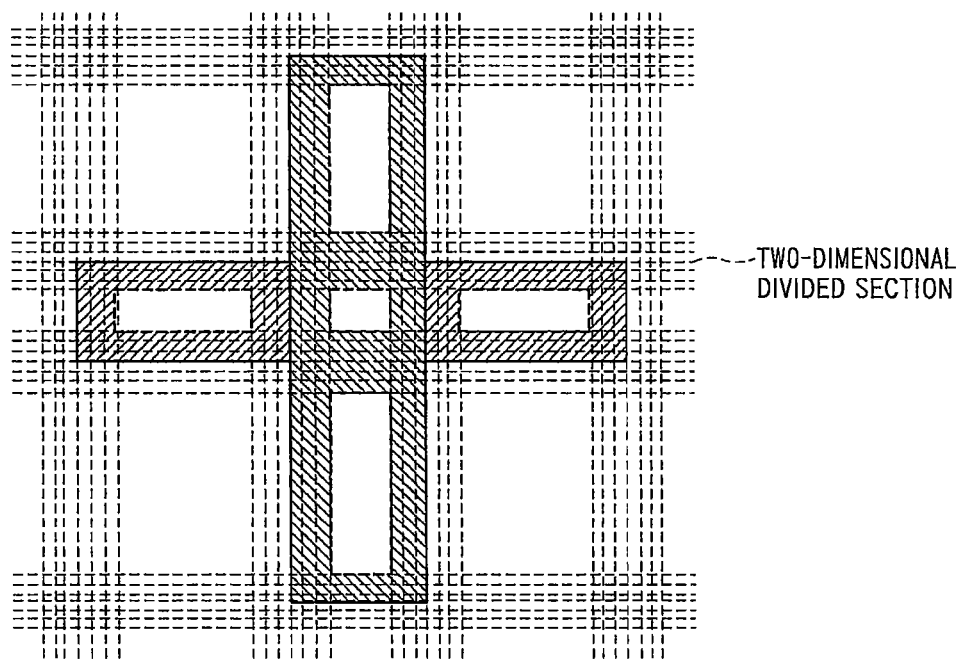
FIG. 6 is a diagram showing an example of how to divide the margin region shown in FIG. 5 into two-dimensional sections at an interval specified by an operator.

As shown in FIG. 6, the two-dimensional section dividing processing unit 31 then performs selective removal to the inside of the margin region M2 so as to be divided at the interval specified by the operator, and performs selective removal to other regions so as to be divided at an interval wider than the interval specified by the operator, thereby dividing the regions into a plurality of sets of two-dimensional sections each having an intersection. The boundary of the mask pattern is a region expected to three-dimensionally change in shape to a considerable degree, and is preferably divided at a narrower interval. According to the present embodiment, the two-dimensional section dividing processing unit 31 can automatically set the margin region M2 from the inputted mask pattern information, so that the efficiency of processing can be improved.

Figure 7:
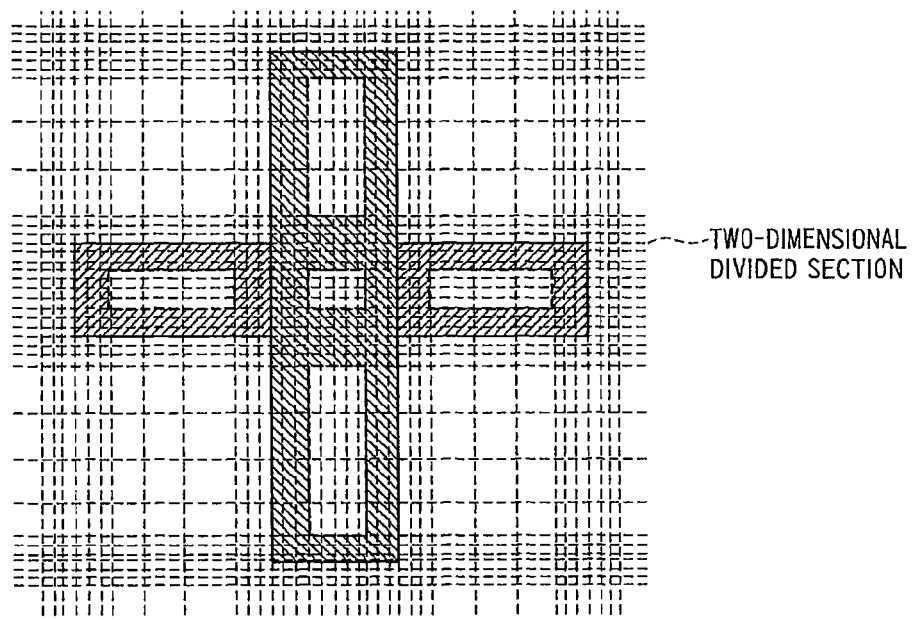
FIG. 7 is a diagram showing an example of how to further divide the two-dimensional sections in a mask overlapping region at an interval specified by the operator, and divide the two-dimensional sections in other regions at an interval larger than the interval specified by the operator, regarding the two-dimensional section dividing example in FIG. 6.
Figure 8:
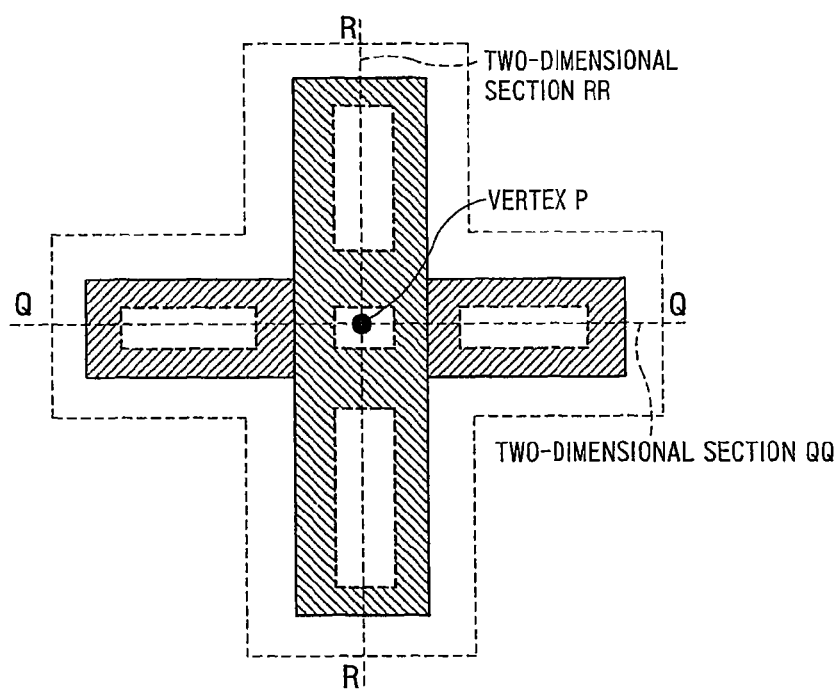
FIG. 8 is a diagram showing two two-dimensional sections in the two-dimensional section dividing example in FIG. 7, and a vertex which is the intersection of the two sections.

Furthermore, the two-dimensional section dividing processing unit 31 judges whether the inputted mask pattern has any region where masks overlap. When there is a region where masks overlap, this mask overlapping region is also divided into two-dimensional sections at the interval specified by the operator, and other regions are divided at an interval wider than the interval specified by the operator. In the end, as shown in FIG. 7, the regions are divided into a plurality of sets of two-dimensional sections each having an intersection in such a manner that the interval varies region by region.

The two-dimensional section dividing processing unit 31 also functions to set the interval of dividing into two-dimensional sections in each time step. Thus, the dividing interval can be decided in such a manner that the regions are divided at the interval specified by the operator when a shape change is expected or in such a manner that otherwise division of the regions is selectively omitted. This can also improve the efficiency of processing.

Now, how the one-dimensional combining processing unit 33 combines a one-dimensional film configuration from a plurality of two-dimensional sections passing one intersection is described with reference to FIG. 8 to FIG. 11.

The one-dimensional combining processing unit 33 first acquires two or more two-dimensional sections passing a specified intersection, and acquires one-dimensional film configurations regarding the specified intersection.

Here, the one-dimensional combining processing unit 33 judges whether all of the two or more one-dimensional film configurations to be combined are the same film configuration and have the same thickness. When the one-dimensional film configurations are judged as of the same film configuration, this film configuration is used as a combined one-dimensional film configuration.

Figure 3:
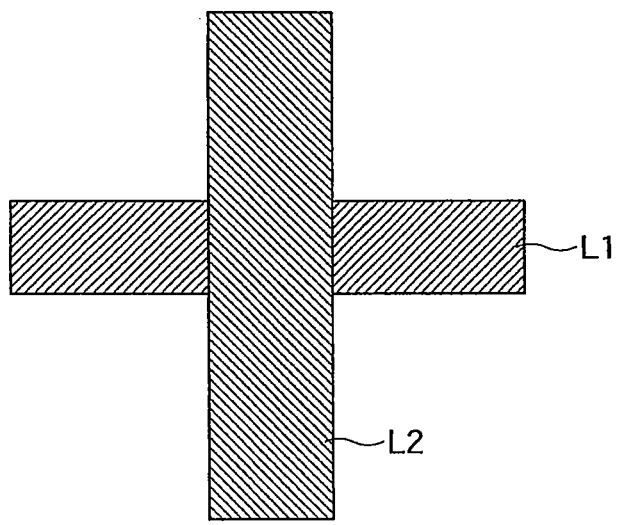
FIG. 3 is a diagram showing an example of a mask pattern inputted to the simulation apparatus in FIG. 1 together with the initial three-dimensional shape in FIG. 2.

For example, provided that the initial three-dimensional shape shown in FIG. 2 and the mask pattern shown in FIG. 3 are inputted. As the shapes of two two-dimensional sections obtained by a two-dimensional shape simulation in a certain time step regarding P which is the intersection of two two-dimensional sections QQ and RR given in FIG. 8, the two-dimensional section QQ is given as shown in FIG. 9A, and the two-dimensional section RR is given as shown in FIG. 9B. In this case, one-dimensional film configurations at the intersection P are as shown in FIG. 10A and FIG. 10B, respectively.

Figure 11:
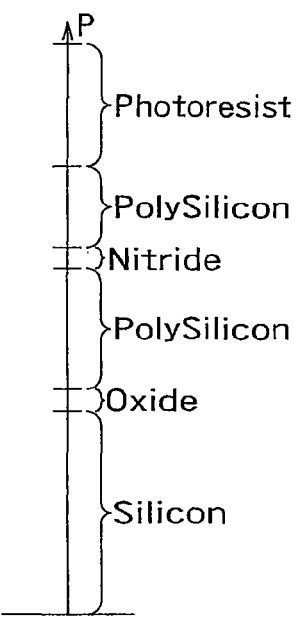
FIG. 11 is a diagram showing a combined one-dimensional film configuration from the two one-dimensional film configurations in FIG. 10A and FIG. 10B.
Figure 12:
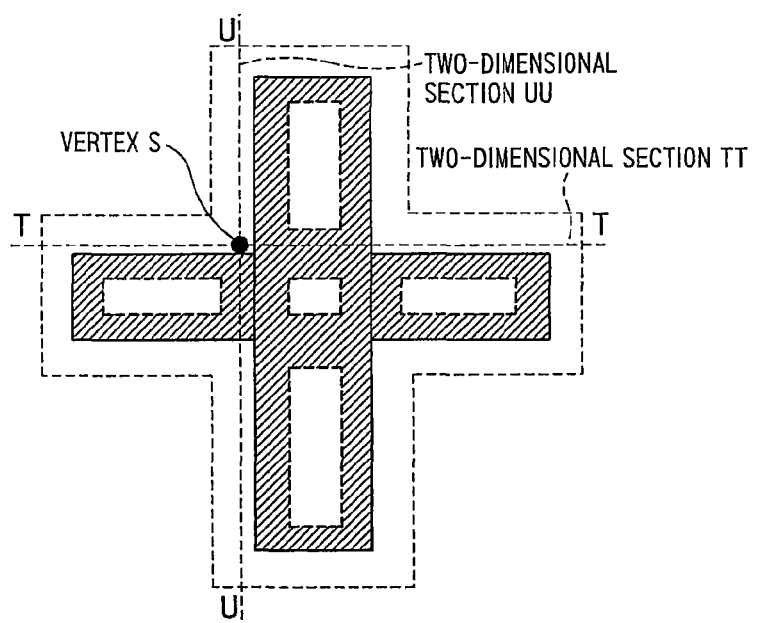
FIG. 12 is a diagram showing two two-dimensional sections different from those in FIG. 8 and a vertex which is the intersection of the two sections, regarding the two-dimensional section dividing example in FIG. 7.

The one-dimensional film configuration shown in FIG. 10A and the one-dimensional film configuration shown in FIG. 10B are the same film configuration and have the same thickness. Therefore, the combining result of the one-dimensional film configurations at the intersection P is as shown in FIG. 11.

On the other hand, when the one-dimensional film configurations to be combined are not judged as of the same configuration as a result of comparison, the one-dimensional combining processing unit 33 combines the one-dimensional film configurations after adding a weight to one of the one-dimensional film configurations to be combined, and takes an average of the film configurations with the addition of each weight, thereby creating a combined one-dimensional film configuration.

More specifically, the inputted mask pattern is drawn from the recording device MR2, and whether there is any two-dimensional section that is predicted to have a higher aspect among two-dimensional sections is judged. When such two-dimensional section is found, the one-dimensional combining processing unit 33 gives a weight for combination, to a one-dimensional film configuration obtained from the two-dimensional section, and takes an average of the film configurations with the addition of the weights, thereby creating a combined one-dimensional film configuration. As the two-dimensional section for which a computation with a higher aspect has been performed provides a more correct simulation result in both a grove bottom and a side surface, it is possible to automatically extract and give weight to a two-dimensional section which is expected from the inputted mask pattern to be have a trench or hole shape that crosses a wiring line. This can improve the efficiency of processing. A section expected to have a high aspect includes, for example, one of a set of sections either one of which crosses a mask pattern.

Figures 13A, 13B:
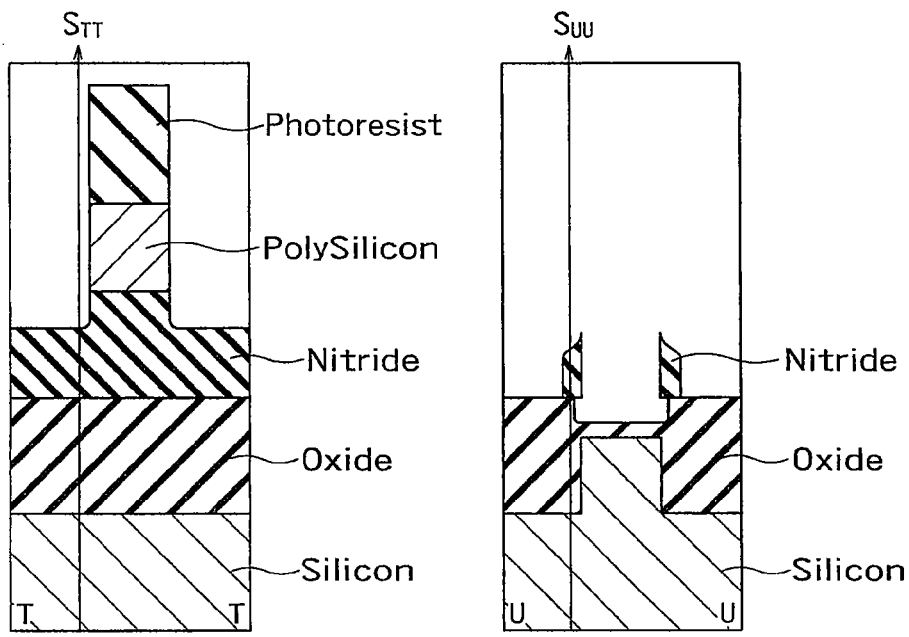
FIG. 13A and FIG. 13B are diagrams showing shapes resulting from a simulation run in a given time step together with the positional relation of the vertex for the two two-dimensional sections in FIG. 12.

For example, provided that the initial three-dimensional shape given in FIG. 2 and the mask pattern given in FIG. 3 are inputted. Regarding S which is the intersection of two two-dimensional sections TT and UU shown in FIG. 12, the shape shown in FIG. 13A is given to the two-dimensional section TT and the shape shown in FIG. 13B is given to the two-dimensional section UU as the shapes of two two-dimensional sections after a simulation in a certain time step. In this case, one-dimensional film configurations at the intersection S are as shown in FIG. 14A and FIG. 14B, respectively.

Figures 14A, 14B:
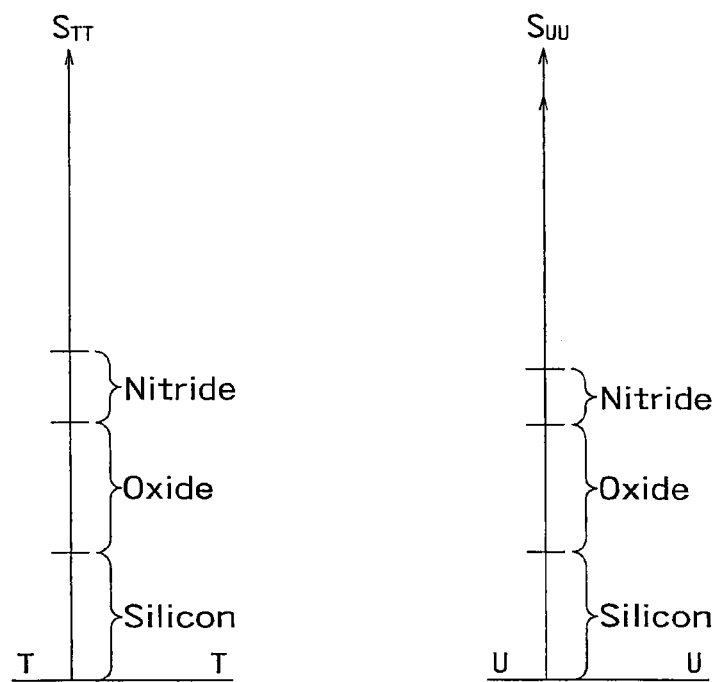
FIG. 14A and FIG. 14B are diagrams showing one-dimensional film configurations respectively obtained from the simulation results in FIG. 13A and FIG. 13B.
Figure 15:
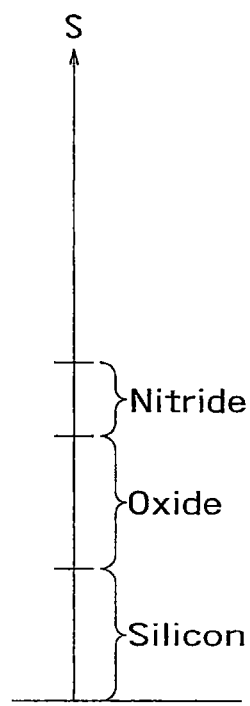
FIG. 15 is a diagram showing a combined one-dimensional film configuration from the two one-dimensional film configurations in FIG. 10A and FIG. 10B with the addition of a weight.

If the thickness of the film configuration in FIG. 14A is compared with the thickness of the film configuration in FIG. 14B, the thickness of a nitride film is different. However, the two-dimensional section TT crosses a higher wiring line. Therefore, if an average is taken by giving a weight added during one-dimensional combination to the thickness of the one-dimensional film configuration obtained from the two-dimensional section TT, the combining result in the one-dimensional film configurations at the intersection S is as shown in FIG. 15.

As a result of judging whether there is any section that is expected to have a higher aspect, the one-dimensional film configurations of two or more two-dimensional sections to be combined in association with one intersection are compared and are not the same configuration. In this case, when there is no section crossing the mask pattern or when there are a plurality of sections crossing the mask pattern, the one-dimensional combining processing unit 33 compares the changes of the film configurations and the amounts of thickness changes from the preceding time step regarding two or more one-dimensional film configurations to be combined, and gives a weight to the one-dimensional film configuration that shows a smaller shape change amount. This is because the three-dimensional effects of the two-dimensional shape simulation are expected to be correct when the shape change amount is smaller. Thus, an accurate film configuration can be predicted.

(2) Simulation Method

Figure 17:
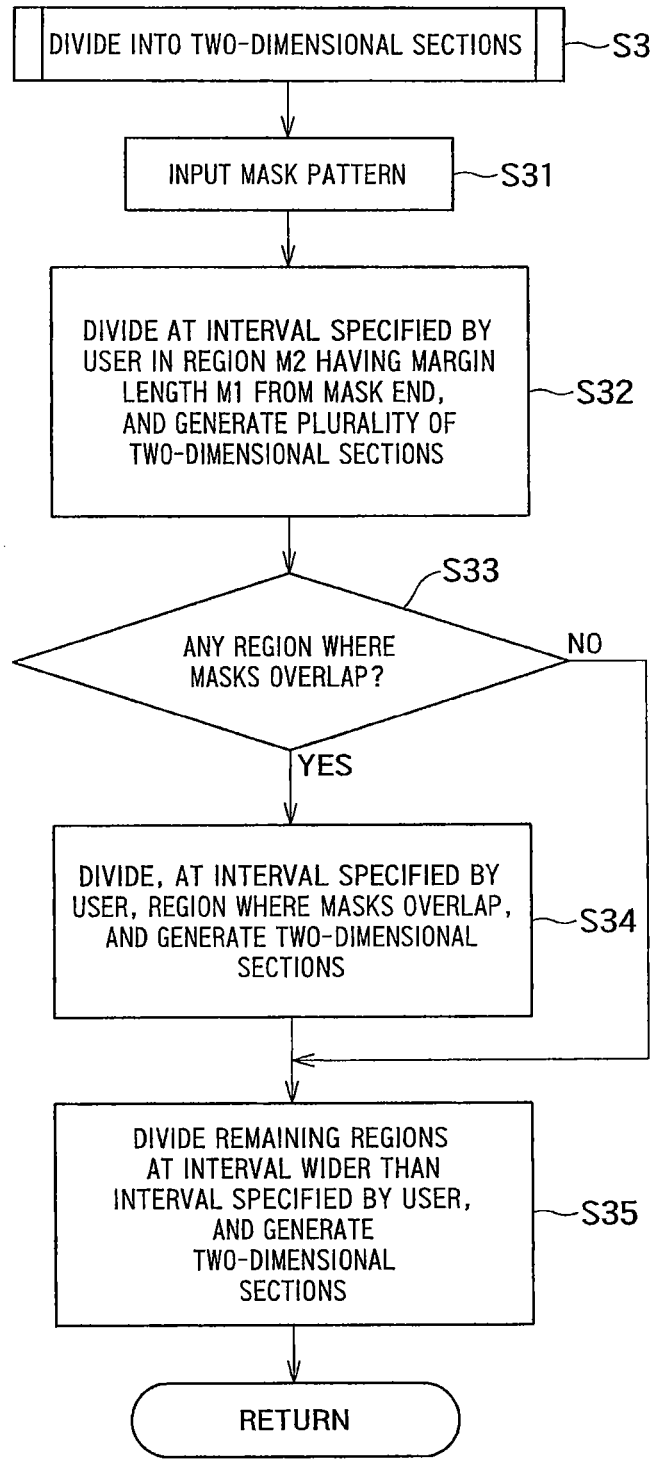
FIG. 17 is a flowchart illustrating in detail the procedure of dividing a three-dimensional shape into two-dimensional sections out of the procedure in FIG. 16.
Figure 18:
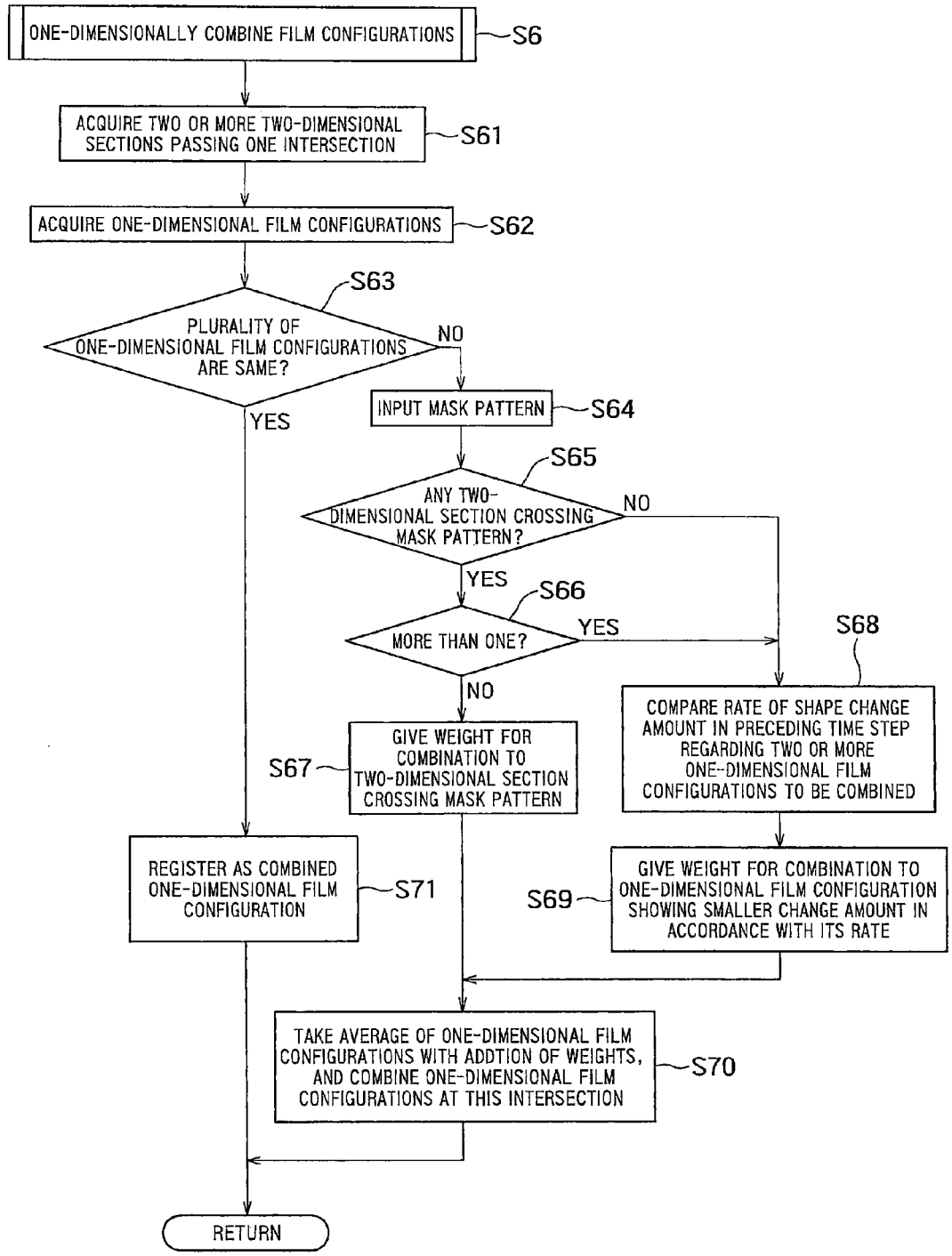
FIG. 18 is a flowchart illustrating in detail the procedure of acquiring a one-dimensional film configuration out of the procedure in FIG. 16.

One embodiment of a simulation method is described with reference to flowcharts in FIG. 16 to FIG. 18.

Figure 16:
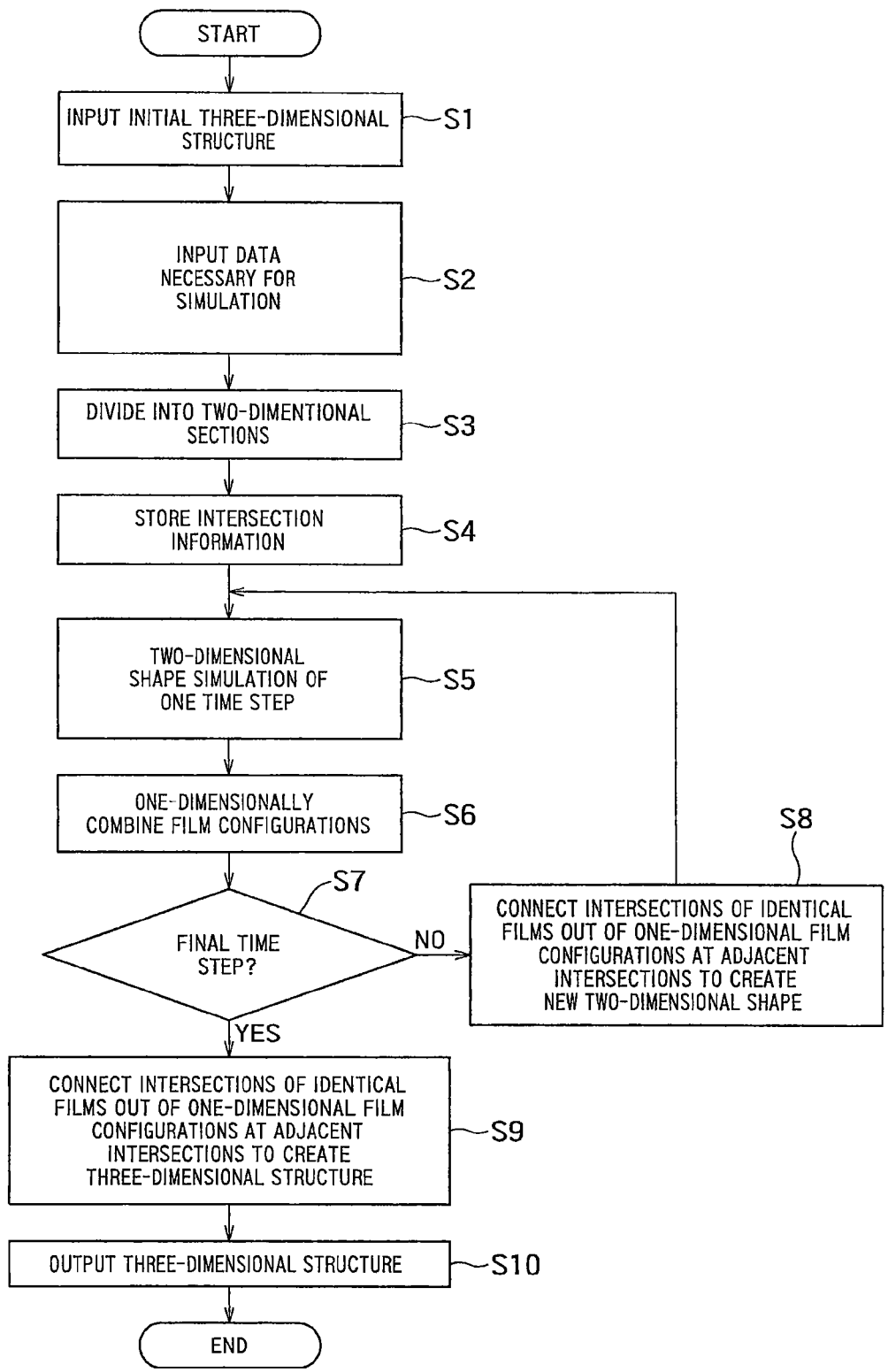
FIG. 16 is a flowchart showing a general procedure of a simulation method according to the embodiment.

First, as shown in the flowchart in FIG. 16, the operator inputs an initial three-dimensional shape (step S1, see FIG. 2), and then inputs data necessary for a simulation (step S2, see FIG. 3).

The initial three-dimensional shape is then divided into a plurality of two-dimensional sections having an intersection when viewed from above (step S3). At the same time, coordinates of the intersection are also registered, for example, by storing the coordinates in the recording device (step S4).

A two-dimensional shape simulation of one time step is then run regarding each of the two-dimensional sections obtained by the dividing (step S5). Regarding each of the two-dimensional sections, film configurations are extracted at each intersection and combined together on the basis of the intersection coordinates registered in step S3, thereby acquiring one-dimensional film configuration (step S6).

It is then judged whether the current two-dimensional simulation is in the final time step with regard to the time step inputted in step S2 (step S7). When the current two-dimensional simulation is not in the final time step, identical films are connected together in association with the one-dimensional film configurations at the adjacent intersections among the one-dimensional film configurations at the adjacent intersections obtained from the intersection coordinates registered in step S4. A new two-dimensional shape is thereby created and newly defined as a two-dimensional section (step S8). The procedure is thus returned back to step S5, a two-dimensional shape simulation of the next time step is then run.

On the other hand, when it is judged in step S7 that the current two-dimensional simulation is in the final time step, a three-dimensional shape is created by connecting the intersections of identical films in association with the one-dimensional film configurations at the adjacent intersections among the one-dimensional film configurations at the adjacent intersections (step S9). The three-dimensional shape is outputted (step S10), and the procedure ends.

Here, a method of extracting a dividing interval from the mask pattern in the procedure of step S4 (FIG. 16) of dividing the three-dimensional shape into two-dimensional sections is described with reference to a flowchart in FIG. 17.

First, a mask pattern is inputted (step S31). The margin region M2 with the margin length M1 is set around a mask pattern boundary BM (see FIG. 5). The inside of the margin region M2 is divided at the interval specified by the operator, and other regions are divided at an interval wider than the interval specified by the operator. The regions are thereby divided into a plurality of sets of two-dimensional sections each having an intersection (step S32, see FIG. 6).

Furthermore, it is judged whether the inputted mask pattern has any region where masks overlap (step S33). When there is a region where masks overlap, this mask overlapping region is also divided into two-dimensional sections at the interval specified by the operator (step S34), and other regions are divided at an interval wider than the interval specified by the operator. In the end, the regions are divided into a plurality of sets of two-dimensional sections each having an intersection in such a manner that the interval varies region by region (step S35, see FIG. 7).

Furthermore, a more specific procedure of step S6 (FIG. 16) to acquire a one-dimensional film configuration on the basis of the intersection coordinates regarding the two-dimensional section obtained by the simulation is described with reference to a flowchart in FIG. 18.

First, two or more two-dimensional sections passing a specified intersection are acquired (step S61), and one-dimensional film configurations regarding the specified intersection are acquired (step S62).

Here, it is judged whether all of the two or more one-dimensional film configurations to be combined are the same film configuration and have the same thickness (step S63). When the one-dimensional film configurations are judge as of the same film configuration, this film configuration is registered as a combined one-dimensional film configuration (step S71).

When, on the other hand, the one-dimensional film configurations are compared in step S63 and are not judge as of the same film configuration, the mask pattern inputted in step S2 (FIG. 16) is first acquired (step S64), and it is judged whether there is any two-dimensional section crossing the mask pattern among the two-dimensional sections (step S65). When there is only one two-dimensional section crossing the mask pattern (No in step S66), a weight for combination is given to a one-dimensional film configuration obtained from the two-dimensional section (step S67), and an average of the film configurations is taken with the addition of the weights and is used as a combined one-dimensional film configuration at this intersection (step S70).

When there is no two-dimensional section crossing the mask pattern (No in step S65) or when there are a plurality of two-dimensional sections crossing the mask pattern (Yes in step S66), the changes of the film configurations and the amounts of thickness changes from the preceding time step are compared regarding two or more one-dimensional film configurations to be combined (step S68). A weight for combination is given to the one-dimensional film configuration that shows a smaller shape change amount in accordance with its rate (step S69). An average of the film configurations is taken with the addition of the weights and is used as a combined one-dimensional film configuration at this intersection (step S70).

According to the simulation apparatus and the simulation method in the above-described at least one embodiment, the shape of a three-dimensional structure can be predicted only by one-dimensional combination based on a two-dimensional shape simulation and its data. Consequently, it is possible to reduce processing time and suppress the volume of data, and thereby effectively use computer resources.

(3) Program and Non-Transitory Recording Medium

A series of procedures of the simulation method described above may be incorporated in a program, and read into and executed by a computer. This enables the simulation described above to be carried out by use of a general-purpose computer. A series of procedures of the simulation described above may be stored in a non-transitory recording medium such as a flexible disk or a CD-ROM as a program to be executed by the computer, and read into and executed by the computer.

The non-transitory recording medium is not limited to a portable medium such as a magnetic disk or an optical disk, and may be a fixed recording medium such as a hard disk drive or a memory. The program incorporating the series of procedures of the simulation described above may be distributed via a communication line (including wireless communication) such as the Internet. Moreover, the program incorporating the series of procedures of the simulation described above may be distributed in an encrypted, modulated or compressed state via a wired line or a wireless line such as the Internet or in a manner stored in a recording medium.

While certain embodiments have been described, these embodiments have been presented by way of example only, and are not intended to limit the scope of the inventions. Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

The invention claimed is:

1. A simulation apparatus comprising:
a two-dimensional section dividing processing unit configured to divide a three-dimensional shape as a simulation target into at least one set of two-dimensional sections intersecting with each other and configured to define the three-dimensional shape as the two-dimensional sections;
a two-dimensional simulator configured to run a two-dimensional shape simulation in each time step for each of the two-dimensional sections obtained by the dividing and configured to acquire a two-dimensional shape;
a one-dimensional combining processing unit configured to extract a film configuration for each intersection of the two-dimensional sections from the acquired two-dimensional shape and configured to combine the film configurations to acquire one-dimensional film configurations; and
a three-dimensional shape combining processing unit configured to create a three-dimensional structure from the acquired one-dimensional film configurations on the basis of information on the intersection.

2. The apparatus of claim 1, further comprising a two-dimensional shape combining processing unit configured to two-dimensionally combine the one-dimensional film configurations obtained by the one-dimensional combining processing unit on the basis of the intersection information and newly define the two-dimensionally combined one-dimensional film configurations as two-dimensional sections,
wherein the two-dimensional simulator runs a two-dimensional shape simulation for each of the newly defined two-dimensional sections up to a final time step, and
the three-dimensional shape combining processing unit creates the three-dimensional configuration from the one-dimensional film configurations acquired by the final time step.

3. The apparatus of claim 1,
wherein the two-dimensional section dividing processing unit comprises a dynamic two-dimensional section dividing function to divide a desired region at a desired interval.

4. The apparatus of claim 1,
wherein the two-dimensional section dividing processing unit divides an arbitrary region comprising a boundary of mask patterns of the three-dimensional shape at a desired interval in a direction parallel to the mask pattern boundary.

5. The apparatus of claim 4,
wherein the two-dimensional section dividing processing unit extracts, from the mask patterns, a region in which masks are expected to intersect as the desired region.

6. The apparatus of claim 3,
wherein the two-dimensional section dividing processing unit changes the interval of the dividing in every time step.

7. The apparatus of claim 1,
wherein when the extracted film configurations are not the same configuration, the one-dimensional combining processing unit performs the combining by giving a weight to the film configuration which is smaller in shape change amount than a film configuration of a time step prior to the time step of the extracted film configurations.

8. The apparatus of claim 4,
wherein when the extracted film configurations are not the same configuration, the one-dimensional combining processing unit performs the combining by giving a weight to the film configuration obtained from the two-dimensional section which is expected to be higher in shape aspect from the mask patterns.

9. The apparatus of claim 1,
wherein the two-dimensional section dividing processing unit performs the dividing in such a manner that the two two-dimensional sections intersect at an angle other than 90 degrees.

10. A simulation method implemented by a simulation apparatus that includes circuitry, the simulation method comprising:

dividing, by the circuitry of the simulation apparatus, a three-dimensional shape as a simulation target into at least one set of two-dimensional sections intersecting with each other;

running, by the circuitry of the simulation apparatus, a two-dimensional shape simulation in each time step regarding each of the two-dimensional sections and thereby acquiring a two-dimensional shape;

extracting, by the circuitry of the simulation apparatus, a film configuration for each intersection of the two-dimensional sections from the acquired two-dimensional shape and then combining the film configurations to acquire one-dimensional film configurations; and creating, by the circuitry of the simulation apparatus, a three-dimensional structure from the acquired one-dimensional film configurations on the basis of information on the intersection.

11. The method of claim 10, further comprising two-dimensionally combining the acquired one-dimensional film configurations on the basis of the intersection information to newly create a two-dimensional shape, and running a two-dimensional shape simulation of the next time step to acquire a new two-dimensional shape, wherein the acquisition of the one-dimensional film configurations and the acquisition of the new two-dimensional shape are repeated up to a final time step, and the three-dimensional structure is created from the one-dimensional film configurations acquired by the final time step.

12. The method of claim 10, wherein the dividing comprises dividing a desired region at a desired interval.

13. The method of claim 12, further comprising reading mask pattern information comprising a boundary of mask patterns of the three-dimensional shape, wherein the dividing comprises dividing an arbitrary region comprising the mask pattern boundary at a desired interval in a direction parallel to the mask pattern boundary.

14. The method of claim 13, further comprising reading a plurality of pieces of mask pattern information on the three-dimensional shape, wherein the desired region is a region which is extracted from the mask patterns and in which masks are expected to intersect.

15. The method of claim 12, wherein the interval of dividing is changeable in every time step.

16. The method of claim 10, wherein the acquisition of the one-dimensional film configurations comprises, when the extracted film configurations are not the same configuration to each other, combining by giving a weight to the film configuration which is smaller in shape change amount than a film configuration of a time step prior to the time step of the extracted film configurations.

17. The method of claim 13, wherein the acquisition of the one-dimensional film configurations comprises, when the extracted film configurations are not the same configuration to each other and when mask pattern information is readable, combining by giving a weight to the film configuration obtained from the two-dimensional section which is expected to be higher in shape aspect from the mask patterns.

18. The method of claim 10, wherein the dividing comprises dividing in such a manner that the two two-dimensional sections intersect at an angle other than 90 degrees.

19. A non-transitory computer-readable recording medium including computer executable instructions, wherein the instructions, when executed by a simulation apparatus that includes circuitry, cause the simulation apparatus to perform a method, the method comprising:

dividing, by the circuitry of the simulation apparatus, a three-dimensional shape as a simulation target into at least one set of two-dimensional sections intersecting with each other;

running, by the circuitry of the simulation apparatus, a two-dimensional shape simulation in each time step regarding each of the two-dimensional sections and thereby acquiring a two-dimensional shape;

extracting, by the circuitry of the simulation apparatus, a film configuration for each intersection of the two-dimensional sections from the acquired two-dimensional shape and then combining the film configurations to acquire one-dimensional film configurations; and creating, by the circuitry of the simulation apparatus, a three-dimensional structure from the acquired one-dimensional film configurations on the basis of information on the intersection.

20. The medium of claim 19, wherein the method further comprises two-dimensionally combining the acquired one-dimensional film configurations on the basis of the intersection information to newly create a two-dimensional shape, and running a two-dimensional shape simulation of the next time step to acquire a new two-dimensional shape, the acquisition of the one-dimensional film configurations and the acquisition of the new two-dimensional shape are repeated up to a final time step, and the three-dimensional structure is created from the one-dimensional film configurations acquired by the final time step.

* * * * *